United States Patent [19]
Sakemi

[11] Patent Number: 5,817,542
[45] Date of Patent: Oct. 6, 1998

[54] METHOD FOR BONDING ELECTRONIC COMPONENTS

[75] Inventor: Shoji Sakemi, Fukuoka, Japan

[73] Assignee: Matsushita Electric Industrial Co., Ltd., Osaka, Japan

[21] Appl. No.: 824,054

[22] Filed: Mar. 21, 1997

[30] Foreign Application Priority Data

Mar. 29, 1996 [JP] Japan ................................ 8-076111

[51] Int. Cl.⁶ ................................................ H01L 21/44
[52] U.S. Cl. ..................................... 438/108; 438/118
[58] Field of Search ................................ 438/108, 118, 438/119

[56] References Cited

U.S. PATENT DOCUMENTS

| | | | |
|---|---|---|---|
| 5,138,145 | 8/1992 | Nakamura et al. | 438/118 |
| 5,482,896 | 1/1996 | Tang | 438/118 |
| 5,489,804 | 2/1996 | Pasch | 438/108 |
| 5,579,573 | 12/1996 | Baker et al. | 438/118 |
| 5,627,108 | 5/1997 | Alibocus et al. | 438/118 |

*Primary Examiner*—Kevin Picardat
*Attorney, Agent, or Firm*—Stevens, Davis, Miller & Mosher, L.L.P.

[57] ABSTRACT

It is intended to provide method for bonding a bump formed on an electronic component to a circuit pattern on a substrate, the method being capable of preventing defective connection due to breakage of the conductive adhesives. The method interposes the conductive adhesives between the bump and the circuit pattern, injects the insulating adhesives between the electronic component and the substrate while the temperature is raised to a temperature for curing the conductive adhesives, and lowered to the room temperature, and cures the insulating adhesives, whereby the electronic component is firmly attached to the substrate still at a high temperature and the substrate subsequently cooled to the room temperature cannot be substantially deformed.

5 Claims, 3 Drawing Sheets

METHOD FOR BONDING ELECTRONIC COMPONENTS

BACKGROUND OF THE INVENTION

The present invention relates to a method for bonding bumps on an electronic component to a circuit pattern on a substrate by using adhesives.

Recently, as electronic components with metal bumps have been emerging, a method is put into practical use to bond the bumps on the electronic component to a circuit pattern on a substrate using conductive adhesives.

Now, a conventional bonding method for electronic components is described with reference to FIGS. 3A through 3D. FIG. 3A shows a substrate 1 consisting of glass epoxy or ceramics, and circuit patterns 2 and 3 formed on the surface of the substrate 1, conductive adhesives 4 being applied on these circuit patterns 2 and 3. There is also shown an electronic component 5 mainly comprising a semiconductor chip, and on the bottom surface thereof a plurality of bumps 6 and 7 are projectedly provided.

Then, in the conventional bonding method, the bumps 6 and 7 are caused, as shown in FIG. 3B, to contact the adhesives 4 which is then heated to a temperature of 150° C. or higher for curing. This firmly attaches the bumps 6 and 7 to the circuit patterns 2 and 3, and electrically connects them.

Thus, if, after temperature reaches the curing temperature and the adhesives 4 cure, the temperature is returned to the room temperature, as shown in FIG. 3B, the electronic component 5 is subject to little deformation, but the substrate 1 is substantially deformed and warped. Therefore, as shown in FIG. 3C or FIG. 3D which is an enlarged view of a portion A in FIG. 3C, high stress acts near the interface between the cured adhesives 4 and the circuit pattern 2 at the connection between the substrate 1 and the electronic component 5, and often breaks the adhesives 4, resulting in a defective connection.

SUMMARY OF THE INVENTION

Thus, the present invention is intended to provide a method for bonding an electronic component which can suppress defective connection.

The method for bonding an electronic component according to the present invention comprises the steps of mounting a bump of an electronic component on a circuit pattern through conductive adhesives; heating a substrate and the electronic component to a temperature higher than that for curing the conductive adhesives; injecting insulating adhesives between the electronic component and the substrate while they are heated; and cooling the electronic component and the substrate after both the conductive and insulating adhesives are cured.

Alternatively, the method for bonding an electronic component according to the present invention comprises the steps of placing insulating adhesives on a substrate at a location excluding a circuit pattern and where the electronic component is mounted, the insulating adhesives being cured by heating; mounting a bump of the electronic component on the circuit pattern through conductive adhesives, and mounting the main body of the electronic component on the insulating adhesives; curing both the conductive and insulating adhesives by heating the substrate and the electronic component; and cooling the electronic component and the substrate after both the conductive and insulating adhesives are cured.

According to the present invention, the electronic component and the substrate are maintained at a high temperature from starting of heating of the electronic component and the substrate for curing the conductive adhesives to curing of the conductive and insulating adhesives, and are cooled to the ambient temperature after both adhesives are cured, so that it can be avoided by the insulating adhesives as reinforcement that stress due to deformation of the substrate concentrates on the conductive adhesives, and defective connection can be avoided.

DESCRIPTION OF THE PREFERRED EMBODIMENTS

Figure 1A:
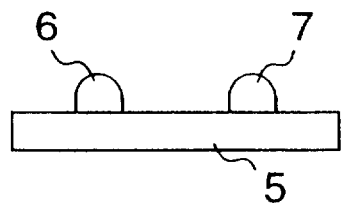
FIGS. 1A through 1C are perspective views explaining steps for carrying out the method for bonding an electronic component according to a first embodiment of the invention.

Now, embodiments of the present invention are described by referring to the drawings.

Figure 1B:
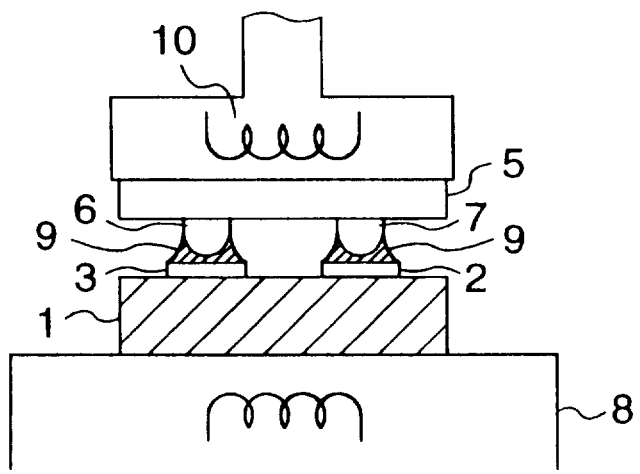
Figure 1C:
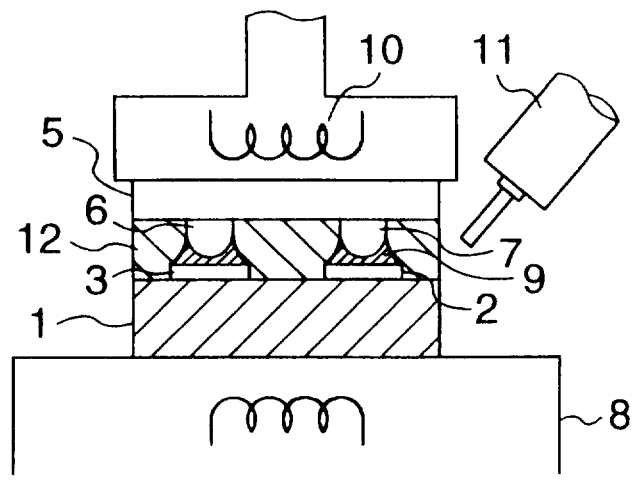

FIGS. 1A through 1C are perspective views explaining steps for carrying out the method for bonding an electronic component according to a first embodiment of the present invention. In the figures, components same as those in FIGS. 3A through 3D are identified with the same reference numerals, for which description is omitted.

In the first embodiment, first, bumps 6 and 7 are formed on the electronic component 5 as shown in FIG. 1A.

Then, the substrate 1 is placed on the upper surface of a positioning table 8 with heating means, and the electronic component 5 is held by a transfer head 10, with the bumps 6 and 7 facing down. Conductive adhesives 9 are applied on circuit patterns 2 and 3 on the substrate 1, or on the tips of bumps 6 and 7. The transfer head 10 is moved downward until the bumps 6 and 7 are positioned on the conductive adhesives 9, and caused to press them downward.

Then, temperature is raised to a temperature for curing the conductive adhesives 9 (typically, 150°–180° C.) to cure the conductive adhesives 9. As heating means, the embodiment has heaters in the positioning table 8 and the transfer head 10. Any other heating means may be employed as long as they can raise the temperature as above.

Then, as shown in FIG. 1C, insulating adhesives 12 are injected between the substrate 1 and the electronic component 5 by using a dispenser 11 before the substrate 1 and the electronic component 5 are cooled back to the room temperature. Then, the insulating adhesives 12 are cured by the above-mentioned heating means.

When the insulating adhesives 12 are thus cured, the conductive adhesives 9 are reinforced therearound, and the electronic component 5 itself is firmly attached to the substrate 1. Therefore, even if the temperature is subsequently cooled back to the room temperature, the substrate 1 cannot be deformed with respect to the electronic component 5, thereby defective connection being avoided.

Figure 2A:
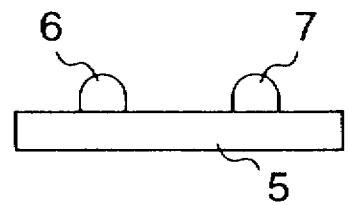
FIGS. 2A through 2C are perspective views explaining steps for carrying out the method for bonding an electronic component according to a second embodiment of the invention.

Now, a second embodiment is described. In the embodiment, bumps 6 and 7 are first formed as in the first embodiment (FIG. 2A).

Figure 2B:
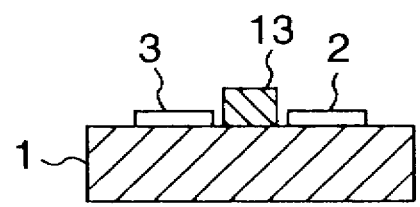

Then, as shown in FIG. 2B, uncured insulating adhesives 13 are placed on a location where circuit patterns 2 and 3 are not formed and where the electronic component is mounted. The insulating adhesives 13 may be typically formed in a block or sheet, but may be of paste. The insulating adhesives 13 have a height higher than that of the bumps 6 and 7.

Then, conductive adhesives 9 are applied on the circuit patterns 2 and 3, or on the tips of the bumps 6 and 7. The transfer head 10 is moved downward to place the bumps 6 and 7 on the conductive adhesives 9, and to mount the main body of the electronic component 5 on the insulating adhesives 13.

Figure 2C:
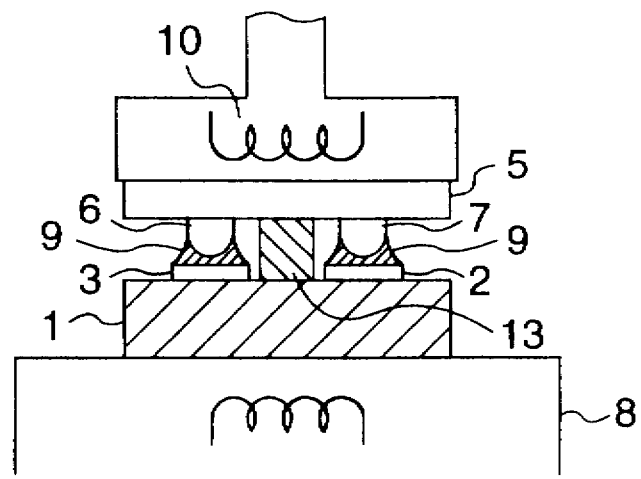
Figure 3A:
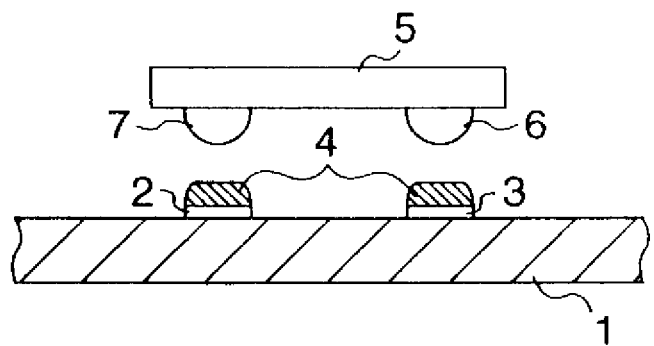
FIGS. 3A through 3D are perspective views explaining steps for carrying out a conventional method for boding an electronic component.
Figure 3B:
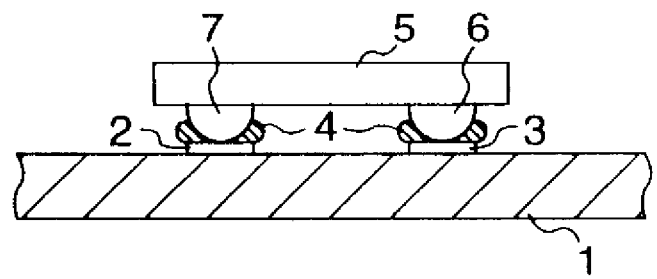
Figure 3C:
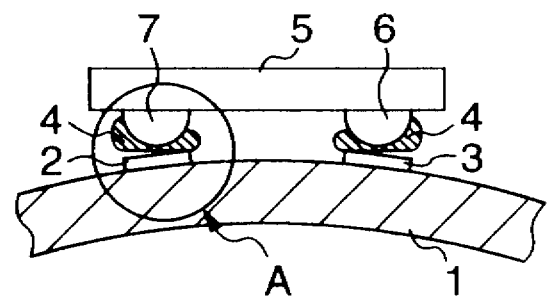
Figure 3D:
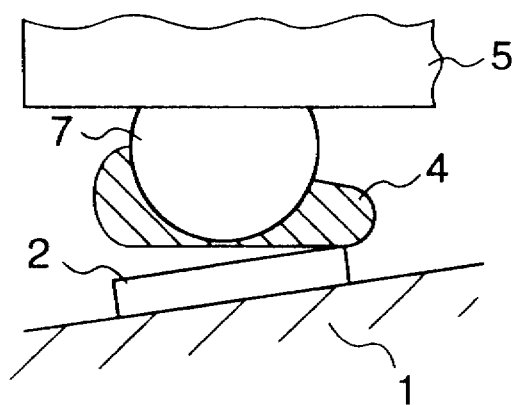

Then, as well as in the first embodiment, the substrate 1 and the electronic component 5 are heated. In other words, as shown in FIG. 2C, in this case, the insulating adhesives 13 are closely held between the substrate 1 and the electronic component 5. When they are simultaneously heated, the conducive and insulating adhesives 9 and 13 are cured so that the electronic component 5 is firmly attached on the substrate 1.

When the conductive and insulating adhesives 9 and 13 are cured, heating is discontinued, and the substrate 1 and the electronic component 5 are cooled to the room temperature. Therefore, as well as in the first embodiment, even when the temperature is cooled back to the room temperature, the substrate 1 cannot be deformed with respect to the electronic component 5, thereby defective connection being avoided.

Since the method for bonding an electronic component according to the present invention interposes the conductive adhesives between the bump and the circuit pattern, injects the insulating adhesives between the electronic component and the substrate while the temperature is raised to a temperature for curing the conductive adhesives, and lowered to the room temperature, and cures the insulating adhesives, the electronic component is firmly attached to the substrate still at a high temperature, and the substrate subsequently cooled to the room temperature cannot be substantially deformed, so that defective connection due to breakage of the conductive adhesives can be suppressed.

What is claimed is:

1. A method for bonding a bump formed on an electronic component to a circuit pattern on a substrate, the method comprising:

(a) mounting the bump of the electronic component on the circuit pattern through conductive adhesives;

(b) heating said substrate and said electronic component from an initial temperature to a temperature higher than required for curing said conductive adhesives;

(c) injecting insulating adhesives between said electronic component and said substrate before said electronic component and said substrate cool back to said initial temperature; and (d) cooling said electronic component and said substrate after both said conductive and insulating adhesives are cured.

2. A method as in claim 1, wherein the initial temperature is room temperature.

3. A method as in claim 1, wherein step (a) comprises:

(i) mounting the substrate on a positioning table;

(ii) mounting the electronic component on a transfer head; and (iii) causing relative movement between the positioning table and the transfer head such that the bump is mounted on the circuit pattern through the conductive adhesives.

4. A method as in claim 3, wherein:

each of the positioning table and the transfer head comprises a heater element; and step (b) comprises generating heat with the heater element of the positioning table and the heater element of the transfer head.

5. A method as in claim 1, wherein step (d) comprises cooling the electronic component and the substrate back to the initial temperature.

* * * * *